United States Patent [19]
Toda et al.

[11] Patent Number: 5,388,125
[45] Date of Patent: Feb. 7, 1995

[54] FREQUENCY CONVERTER CIRCUIT WITH IMPROVED INTERMEDIATE FREQUENCY STABILITY

[75] Inventors: Yoshifumi Toda; Masahiro Onoda, both of Kawasaki, Japan

[73] Assignee: Fujitsu Limited, Kawasaki, Japan

[21] Appl. No.: 928,420

[22] Filed: Aug. 12, 1992

[30] Foreign Application Priority Data

Aug. 12, 1991 [JP] Japan ............... 3-201990

[51] Int. Cl.⁶ ............ H03D 3/22; H04B 1/26
[52] U.S. Cl. ............ 375/86; 375/93;
375/97; 455/182.2; 455/192.2; 455/196.1;
455/260; 455/316; 455/318
[58] Field of Search ............ 455/86-87,
455/182.2, 192.2, 196.1, 197.1, 209, 260, 265,
314-316, 318-319; 375/83, 93, 97, 86; 329/306

[56] References Cited

U.S. PATENT DOCUMENTS

| | | | |
|---|---|---|---|
| 4,491,976 | 1/1985 | Saitoh et al. | 455/315 |
| 4,932,072 | 6/1990 | Toko | 455/316 |
| 5,115,515 | 5/1992 | Yamamoto et al. | 455/316 |
| 5,179,729 | 1/1993 | Mishima et al. | 455/316 |

FOREIGN PATENT DOCUMENTS

| | | |
|---|---|---|
| 0354986 | 2/1990 | European Pat. Off. |
| 0406851 | 1/1991 | European Pat. Off. |
| 0412207 | 2/1991 | European Pat. Off. |
| 2417888 | 2/1979 | France |
| 2-112323 | 4/1990 | Japan |

OTHER PUBLICATIONS

*Patent Abstracts of Japan,* vol. 5, No. 34 (E-48) 4, Mar. 1981 & JP-A-161415 (Hitachi Ltd) Dec. 16, 1980.

Primary Examiner—Curtis Kuntz
Assistant Examiner—Andrew Faile
Attorney, Agent, or Firm—Staas & Halsey

[57] ABSTRACT

A frequency converter circuit which includes a first frequency conversion unit which mixes a received signal and a first local oscillation signal to produce a first intermediate frequency signal and a second frequency conversion unit which mixes the first intermediate frequency signal and a second local oscillation signal to produce a second intermediate frequency signal. Here, the first frequency deviation included in the first local oscillation signal and the second frequency deviation included in the second local oscillation signal are combined and applied to the reference oscillation unit. The oscillation frequency of the reference oscillation unit is subjected to feedback control so that the combined frequency deviation becomes zero. This feedback is formed so that a first and second local oscillation signals are produced based on reference signals obtained by dividing a reference signal having the oscillation frequency by a first dividing ratio and a second dividing ratio.

18 Claims, 9 Drawing Sheets

FREQUENCY CONVERTER CIRCUIT WITH IMPROVED INTERMEDIATE FREQUENCY STABILITY

BACKGROUND OF THE INVENTION

1. Field of the Invention

The present invention relates to a frequency converter circuit for converting a modulated received signal to an intermediate frequency signal, and more particularly relates to a frequency converter circuit suitable for use in a mobile terminal in, for example, a mobile telecommunication system.

In general, in car telephone systems and other mobile telecommunication systems, a reference oscillation circuit is provided and a local oscillation signal for frequency conversion or a carrier signal for modulation is obtained based on an oscillation signal of this reference oscillation circuit.

In such mobile telecommunication systems, along with the increase in demand in recent years, a demand has arisen for more effective use of the frequency spectrum by reducing the interval between channels and by interleaving of frequency allocations.

In order to meet these demands, it is necessary to raise the frequency stability of the radio frequency signal (hereinafter referred to as the "RF signal").

In general, when sending an RF signal from a base station to a mobile terminal, it is possible to secure a high frequency stability. This is because it is possible to provide the base station with an oscillation circuit with a high precision of better than 0.1 ppm as the reference oscillation circuit.

As opposed to this, when sending an RF signal from the mobile terminal to the base station, a high frequency stability cannot be secured. This is because the ambient conditions of use of the mobile terminal are stringent, so the precision of the reference oscillation circuit is limited to about 3 ppm.

Therefore, to meet the above demands, it is necessary to enhance the frequency stability of the RF signal transmitted by the mobile terminal.

In conventional mobile terminals, the oscillation frequency of the reference oscillation circuit was designed to be controlled based on the RF signal sent from the base station.

If using such a construction, since the frequency stability of the RF signal sent from the base station is high, it is possible to also raise the frequency stability of the RF signal sent from the mobile terminal. Note that such a construction is adopted as is in the present invention as well (mentioned later).

In the above-mentioned mobile telecommunication systems, however, conventionally, the main signal, that is, the speech signal, has been treated through analog processing.

In such analog mobile telecommunication systems, use is made of the frequency modulation (FM) method as the modulation method, so not that high a frequency stability has been required of the received intermediate frequency (IF) signal.

2. Description of the Related Art

As opposed to this, in recent years, digital processing of a speech signal has been considered for such mobile telecommunication systems. In such digital mobile telecommunication systems, one type of phase shift keying (PSK) modulation method, i.e., the $\pi/4$ shift quadrature PSK (QPSK) modulation method, is in general use as the modulation method, and the received signal has been processed by a double superheterodyne receiving system. When use is made of the $\pi/4$ shift QPSK modulation method as the modulation method, the deviation of the frequency of a second intermediate frequency signal, the input signal of the demodulation circuit (hereinafter referred to as the "second intermediate frequency"), is converted to phase error. This increases tremendously the possibility of deterioration of the error rate of the demodulation output. Note that in a double superheterodyne receiving system, a first intermediate frequency signal exists before the second intermediate frequency signal.

With a frequency converter circuit in a conventional double superheterodyne receiving system, as will be explained later with reference to the drawings, even if it is attempted to stabilize the frequency of the first intermediate frequency signal, due to the features of the circuit construction, there is the problem that it is not easy to also satisfactorily stabilize the frequency of the second intermediate frequency signal.

SUMMARY OF THE INVENTION

Therefore, the present invention, in view of the above problems, has as its object the provision of a frequency converter circuit which can achieve stabilization of the second intermediate frequency even if the frequency stability of the reference oscillation circuit is relatively low.

To achieve the above object, the present invention provides a frequency converter circuit comprising a first frequency conversion means which mixes a modulated received signal and a first local oscillation signal and thereby produces a first intermediate frequency signal having a frequency of a difference between the frequencies of these signals; a second frequency conversion means which mixes the first intermediate frequency signal from the first frequency conversion means and a second local oscillation signal and thereby produces a second intermediate frequency signal having a frequency of a difference between the frequencies of these signals; and a frequency feedback loop which receives as input a signal branched from the second intermediate frequency signal and stabilizes in common the frequencies of the first intermediate frequency signal and the second intermediate frequency signal.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior art and the problems therein will be first described with reference to the related figures.

Figure 1:
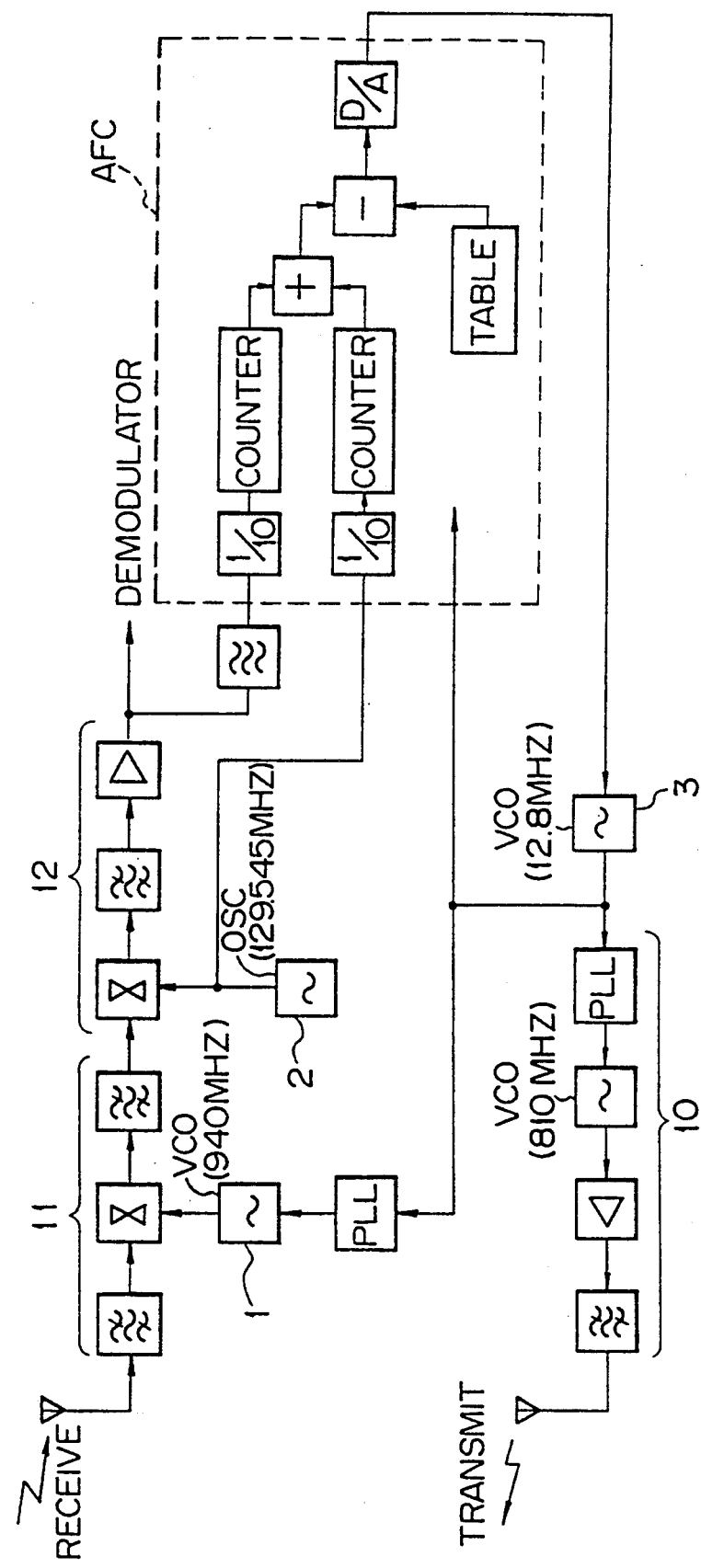
FIG. 1 is a circuit diagram showing one example of a frequency converter circuit in a conventional superheterodyne receiving and transmitting apparatus.

FIG. 1 is a circuit diagram showing one example of a frequency converter circuit in a conventional superheterodyne receiving and transmitting apparatus.

As mentioned earlier, it is desirable to stabilize the second intermediate frequency in a digital mobile telecommunication system. To make the second intermediate frequency stable, it is necessary at least that the frequency of the received RF signal (hereinafter referred to as the "RF frequency") be stable and that the frequency of the local oscillation signal for frequency conversion (hereinafter referred to as the "local oscillation frequency") be stable. Further, for the received RF frequency to be stable, it is necessary at least that the frequency of the transmitted RF frequency be stable. For the local oscillation frequency to be stable, the oscillation frequency of the reference oscillation circuit must be stable.

Here, the transmitted RF frequency is kept stable, as mentioned above, when the RF signal is sent from a base station to the mobile terminal or the case where the RF signal is sent from a mobile terminal to the base station. Therefore, the received RF frequency can be ensured a high stability at either of the base station and the mobile terminal as well.

As opposed to this, the oscillation frequency of the reference oscillation circuit, as mentioned above, can be ensured a stable frequency at the base station, but cannot be ensured a stable frequency at the mobile terminal. Due to this, the local oscillation frequency can be ensured a high stability at the base station, but cannot be ensured a high stability at the mobile terminal.

Referring to the conventional example of FIG. 1, in this frequency converter circuit, for the second frequency conversion means 12, it is attempted to stable the second intermediate frequency by a fixed reference oscillation circuit 2. For the first intermediate frequency, a high frequency stability is realized by a variable reference oscillation circuit (VCO—voltage controlled oscillator) 2, an automatic frequency control (AFC) circuit, and a separate variable reference oscillation circuit 3.

The transmission side circuit 10 shares the variable reference oscillation circuit 3, so the frequency stability of the signal transmitted from the transmission side circuit 10 is kept high.

In the final analysis, in the conventional example of FIG. 1, if it is attempted to obtain the object of the present invention, that is, a high stability second intermediate frequency, the stability of the abovementioned fixed reference oscillation circuit 3 must be made extremely high. A fixed reference oscillation circuit 3 with such a high stability would become large in scale and thus would not be suited as a reference oscillation circuit for a mobile terminal where small size is required, for example.

From the above it will be understood that at the present time, it is possible to obtain a high stability second intermediate frequency at the base station, but it is not possible to obtain a high frequency stability second intermediate frequency at the mobile terminal. Therefore, in a mobile telecommunication network using a PSK modulation method, it is necessary to realize the mobile terminal by digital circuits. It is desired that the stabilization of the second intermediate frequency of the mobile terminal be quickly achieved so as to enable progress in digitalization.

Figure 2:
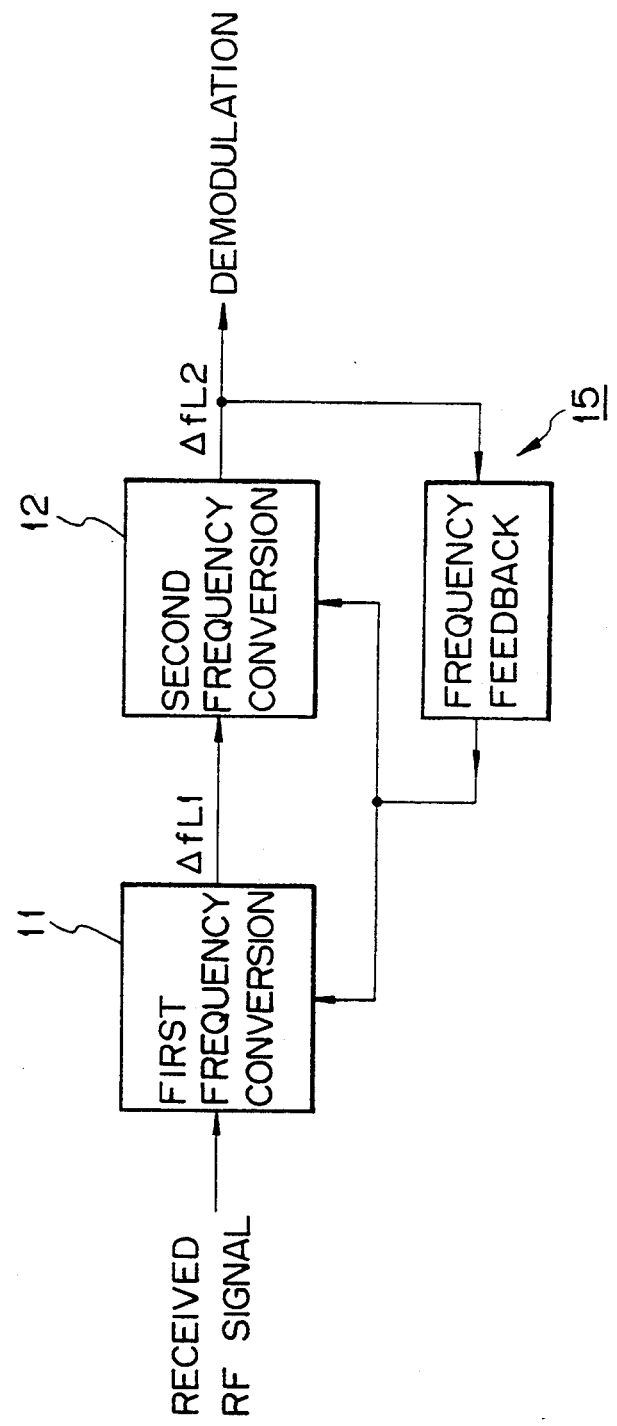
FIG. 2 is a view of the principle and constitution of a frequency converter circuit in accordance with the present invention.

FIG. 2 is a view of the principle and constitution of a frequency converter circuit in accordance with the present invention. In the figure, reference numeral 11 is a first frequency conversion means, 12 is a second frequency conversion means, and 15 is a frequency feedback loop. The characteristic feature of the present invention is in the frequency feedback loop, in particular.

A first frequency conversion means 11 mixes a modulated received signal and a first local oscillation signal and thereby produces a first intermediate frequency signal having a frequency of a difference between the frequencies of these signals A second frequency conversion means 12 mixes the first intermediate frequency signal from the first frequency conversion means and a second local oscillation signal and thereby produces a second intermediate frequency signal having a frequency of a difference between the frequencies of these signals.

A frequency feedback loop 15 receives as input a signal branched from the second intermediate frequency signal and stabilizes in common the frequencies of the first intermediate frequency signal and the second intermediate frequency signal.

Figure 3:
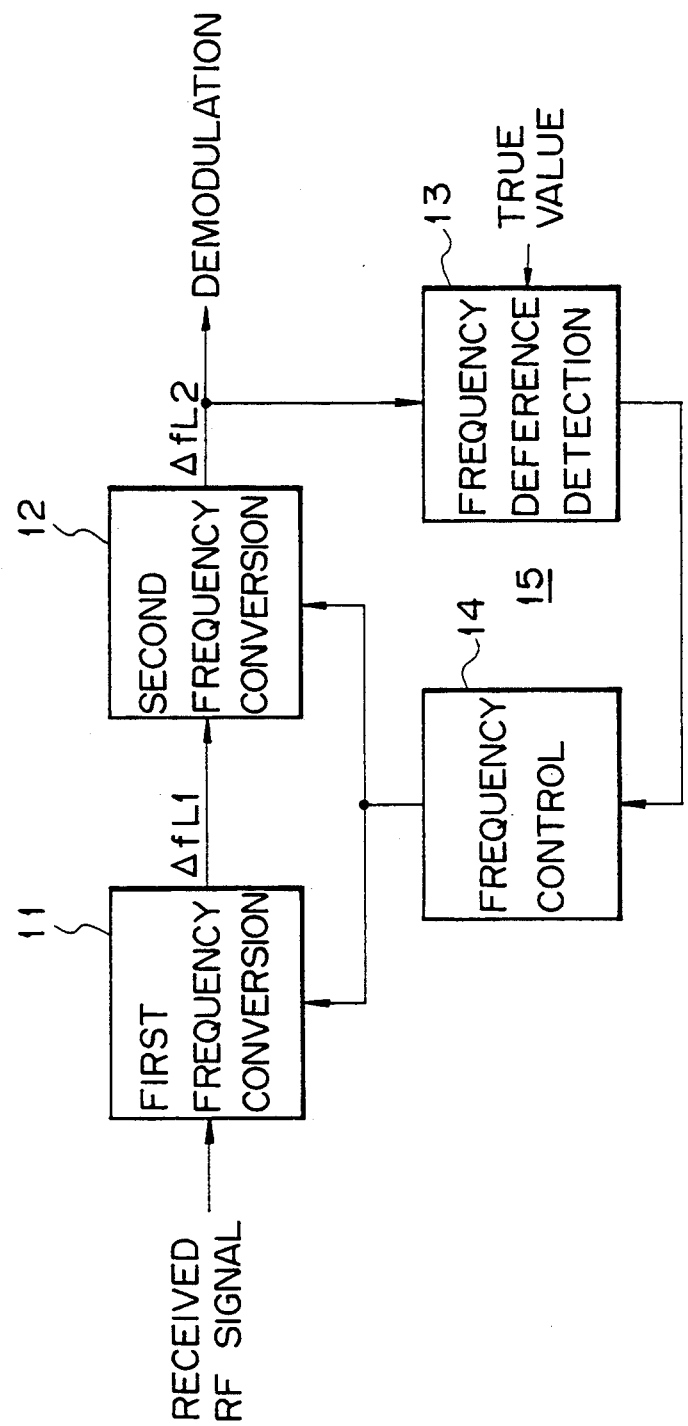
FIG. 3 is a block diagram showing an example based on the present invention.

FIG. 3 is a block diagram showing an example based on the present invention. The figure shows a specific preferred example of the constitution of the frequency feedback loop 15. That is, the frequency feedback loop 15 includes a frequency difference detection means 13 and a frequency control means 14.

The frequency difference detection means 13 detects the frequency of the difference between the frequency of the second intermediate frequency signal and a true value which the frequency should have.

The frequency control means 14 controls in common the frequencies of the first and second intermediate frequency signals (fL1 and fL2) based on the detection output of the frequency difference detection means 13.

In the constitution of FIG. 3, the frequency stability of the signal transmitted from the base station (not shown) and received by the mobile terminal is high, so only the frequency deviation $\Delta fL1$ of the first local oscillation signal appears as the frequency deviation in the conversion output of the first frequency conversion means 11.

Similarly, the combined deviation of the frequency deviation $\Delta fL1$ of the first local oscillation signal and the frequency deviation $\Delta fL2$ of the second local oscillation signal appears in the conversion output of the second frequency conversion means 12.

Due to this, the frequency deviations $\Delta fL1$ and $\Delta fL2$ are detected by the frequency difference detection means 13. Therefore, if the first and second local oscillation frequencies are controlled in common by the frequency control means 14 based on the detection output of the frequency difference detection means 13, it is possible to remove the combined deviation of the frequency deviations ΔfL1 and ΔfL2 from the conversion output of the second frequency conversion means 12.

Due to this, it is possible to obtain a second intermediate frequency signal of a high frequency stability, e.g., 3 ppm, even if the frequency stability of the reference oscillation circuit is low.

Figure 4:
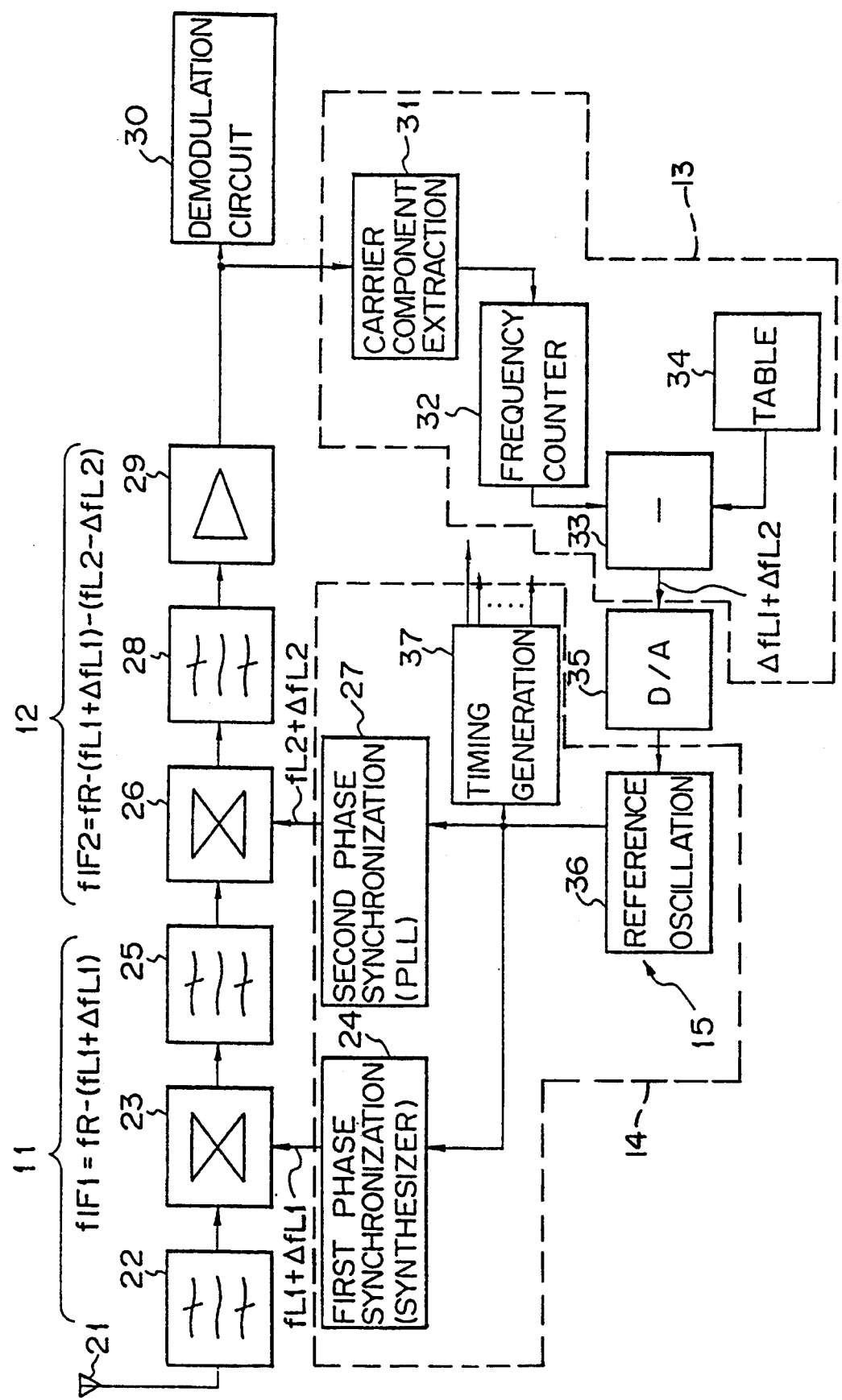
FIG. 4 is a circuit diagram showing the more specific constitution of the embodiment shown in FIG. 3.

FIG. 4 is a circuit 23 diagram showing the more specific constitution of the embodiment shown in FIG. 3. In the figure, the frequency control means 14 is provided with a reference oscillation unit 36 which is controlled in oscillation frequency in accordance with the detection output from the frequency difference detection means 13, a first phase synchronization unit 24 which uses the oscillation output from the reference oscillation unit as the reference signal and synchronizes the phase of the first local oscillation signal with respect to that of the reference signal, and a second phase synchronization unit 27 which similarly uses the oscillation output from the reference oscillation unit as the reference signal and synchronizes the phase of the second local oscillation signal with respect to that of the reference signal.

As one example, the first phase synchronization unit 24 is formed as a synthesizer and the second phase synchronization unit 27 is formed as a phase-locked loop (PLL) circuit.

On the other hand, the frequency difference detection means 13 comprises a carrier component extraction unit 31 which extracts the carrier component from the second intermediate frequency signal, a frequency counter 32 which counts the carrier frequency extracted from the carrier component extraction unit 31; a table 34 which holds as data the true values which the second intermediate frequency signal should have; and a subtraction unit 33 which finds the difference between the true value read out from the table 34 and the value of the carrier frequency counted by the frequency counter and, based on that difference, controls the oscillation frequency of the reference oscillation unit 36.

The carrier component extraction unit 31 is comprised so as to extract the carrier component by multiplying the intermediate frequency signal by N (N being an integer of 2 or more), where the N is determined by the number of shifts and the number of phases for defining the PSK modulation.

The frequency control means 14 further has a timing generation circuit 37 which operates in synchronization with the output of the reference oscillation unit 36, produces a time base signal for the frequency counter 32, a subtraction control timing signal for the subtraction unit 33, and a reading control timing signal for the table 34, and supplies these signals to the same.

Further, if the frequency counter 32, the subtraction unit 33, and the table 34 are formed as digital circuits and the reference oscillation unit 36 is formed as an analog circuit, a digital/analog converter 35 is inserted between the output of the subtraction unit and the reference oscillation unit.

The main route of the frequency converter circuit is shown in the line from the left to right at the very top of FIG. 4. The main elements are the above-mentioned first and second frequency conversion means 11 and 12. As shown in the figure, the first frequency conversion means 11 is comprised of a first band pass filter (BPF) 22 for removing the unnecessary components from the modulated received signal received through an antenna 21, a first mixing circuit 23 which is connected to the first band pass filter, and a second band pass filter 25 for removing the unnecessary components other than the first intermediate frequency signal from the output of the first mixing circuit 23. Further, the second frequency conversion means 12 is comprised of a second mixing circuit 26 which is connected to the output of the second band pass filter 25, a third band pass filter 28 for removing the unnecessary components other than the second intermediate frequency signal from the output of the second mixing circuit 26, and an amplitude limiting amplifier 29 which receives as input the second intermediate frequency signal through the third band pass filter 28.

A supplemental explanation will now be made regarding FIG. 4. Note, however, that the explanation of the present invention will be made taking as a typical case use for a frequency converter circuit of a mobile terminal of a digital mobile telecommunication system using the π/4 shift QPSK modulation method as the PSK modulation method.

The frequency of the first intermediate frequency signal from the first mixing circuit 23 is, for example, set to 130 MHz. Therefore, if, for example, the frequency of the received RF signal is made, for example, 820 MHz, the frequency of the first local oscillation signal becomes 950 MHz.

The first intermediate frequency signal output from the first mixing circuit 23 is supplied, as mentioned earlier, to the band pass filter 25 and is stripped of its unnecessary components. The first intermediate frequency signal from which the unnecessary components have been removed is supplied to the second mixing circuit 26, where it is mixed with a second local oscillation signal output from the PLL circuit 27. Due to this, the second intermediate frequency signal was obtained. Here, the second intermediate frequency is, for example, set to 455 kHz. Therefore, in this case, the second local oscillation frequency becomes 129.545 MHz.

The second intermediate frequency signal output from the second mixing circuit, as mentioned earlier, is cleared of its unnecessary components by the band pass filter 28, then is amplified by the amplitude limiting amplification circuit 29. The amplified output is supplied to the demodulation circuit 30 and the baseband signal is demodulated.

The above was the constitution from the reception to demodulation of the RF signal. Next, an explanation will be made of the constitution of an automatic frequency control loop for stabilizing the second intermediate frequency together with the first intermediate frequency.

The amplification output of the amplitude limiting amplification circuit 29 is further supplied to the carrier component extraction unit 31 and is supplied for the extraction of the demodulation use carrier signal. The extraction output of the unit 31 is counted in frequency by the frequency counter 32. Due to this, data is obtained showing the actual frequency of the second intermediate frequency signal. This data is supplied to one of the input terminals (top in figure) of the subtraction unit 33. The other input terminal (bottom in figure) of the subtraction unit 33 is supplied with binary data showing the true value (455 kHz) of the second center frequency stored in advance in the Table 34. By this, data showing the frequency deviation of the second intermediate frequency signal is obtained from the subtraction unit 33. This data is supplied as the control signal to the reference oscillation unit 36 by the voltage controlled oscillation circuit (VCO) after being converted to an analog signal by a digital/analog converter (D/A) 35.

By this, the oscillation frequency of the reference oscillation unit 36 is controlled based on the frequency deviation of the second intermediate frequency signal. The oscillation frequency of the reference oscillation unit 36 is supplied as a reference signal to the synthesizer 24 and the PLL circuit 27. Due to this, the first local oscillation signal and the second local oscillation signal are synchronized in phase to the oscillation output of the reference oscillation unit 36.

Figure 5:
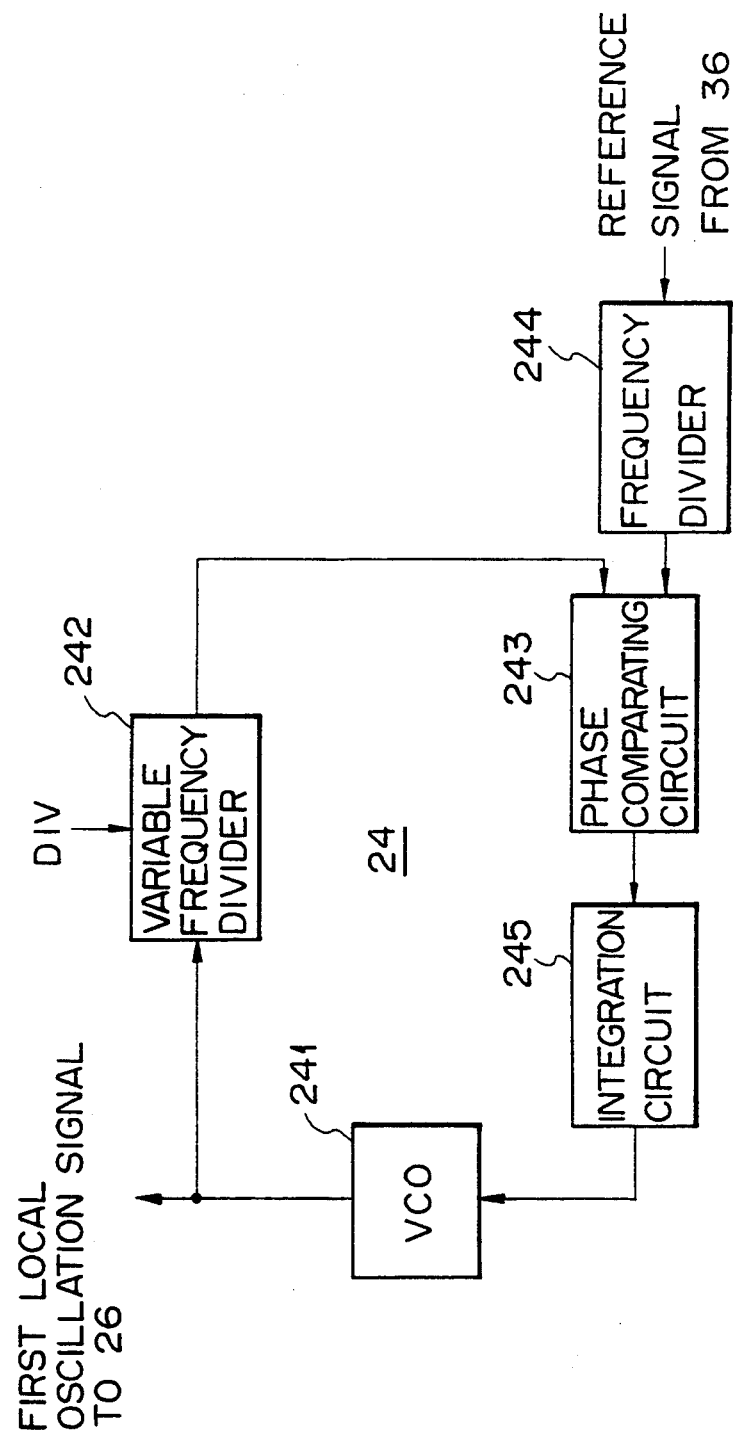
FIG. 5 is a circuit diagram showing a detailed example of the block 24 in FIG. 4.
Figure 6:
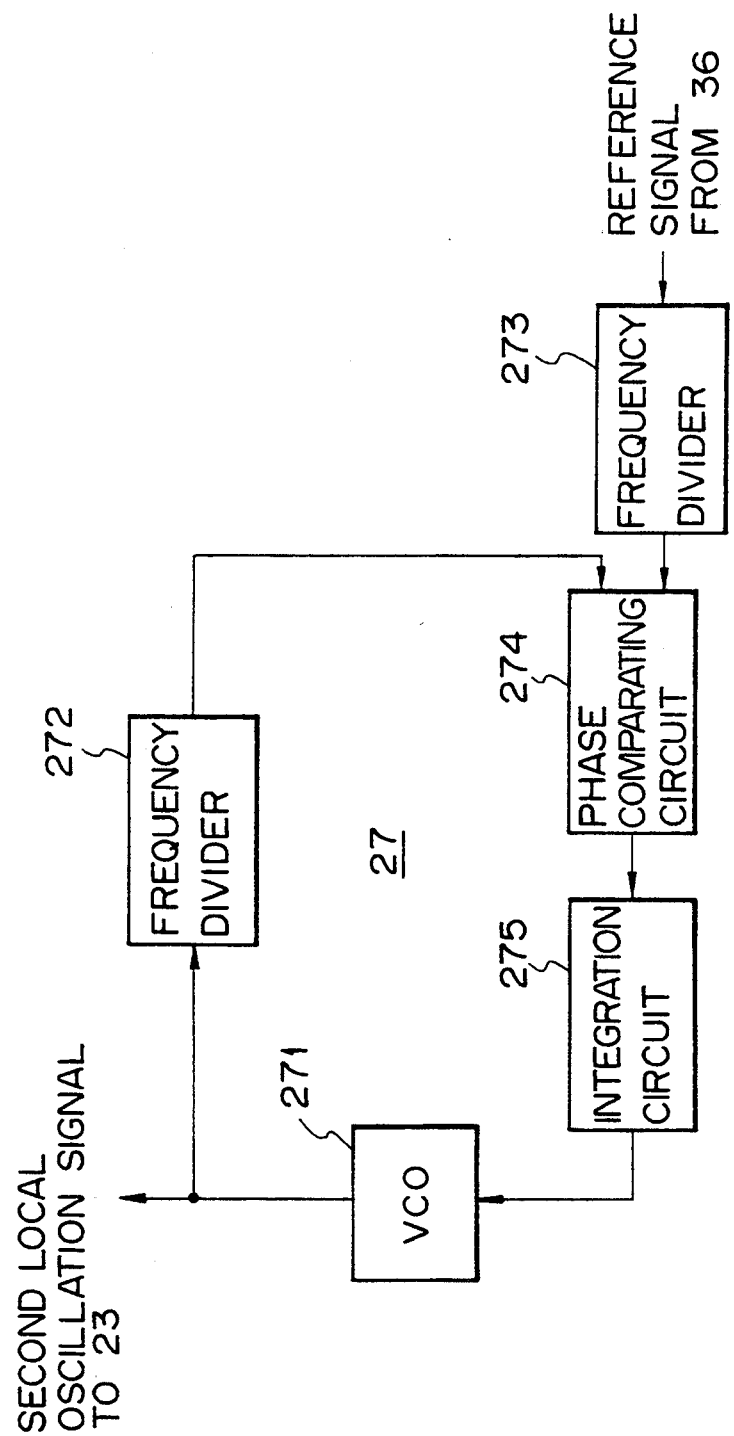
FIG. 6 is a circuit diagram showing a detailed example of the block 27 in FIG. 4.

FIG. 5 is a circuit diagram showing a detailed example of the block 24 in FIG. 4, and FIG. 6 is a circuit diagram showing a detailed example of the block 27 in FIG. 4. Referring to FIG. 5 and FIG. 6, the first phase synchronization unit 24 (FIG. 5) includes a first input stage frequency divider 244 which receives as input the oscillation signal from the reference oscillation unit 36 as a reference signal and a first output stage frequency divider 242 which receives as input the first local oscillation signal.

On the other hand, the second phase synchronization unit 27 PLL circuit (FIG. 6) is comprised of a second input stage frequency divider 273 which receives as input the oscillation signal from the reference oscillation unit 36 as the reference signal and a second output stage frequency divider 272 which receives as input the second local oscillation signal.

The dividing ratios of the frequency dividers 242, 244, 272, and 273 have the following relationship: Assume that the dividing ratio of the frequency divider 242 is P, that of 244 is Q, that of 272 is R, and that of 273 is S. This being so, the following stands:

$$F/P = fL1/Q \text{ and } F/R = fL2/S$$

where, fL1 and fL2 are the frequencies of the first and second local oscillation signals mentioned above, and F is the frequency of the reference signal (oscillation output) from the reference oscillation unit 36. If the ratio of fL1 and fL2 is K, i.e., K=fL1/fL2, then $$K = fL1/fL2 = (Q/P)xF \div (S/R)xF = (Q/P) \div (S/R)$$

Therefore, if Q/P=m and S/R=n, then $$m = K \cdot n$$

That is, m and n are determined and P, Q, R, and S are determined so that m=K·n is satisfied.

More specifically, in FIG. 5, the synthesizer is comprised of a first phase comparison means 243 which receives as input the outputs of the first input stage frequency divider 244 and the first output stage frequency divider 242 and detects the phase difference between those outputs, a first integration circuit 245 which integrates the detection output from the first phase difference detection circuit 243, and a first voltage controlled oscillation circuit (VCO) 241 which uses the output from the first integration circuit 245 as a control voltage and produces the first local oscillation signal.

Further, in FIG. 6, the PLL circuit comprises a second phase comparison circuit 274 which receives as input the outputs of the second input stage frequency divider 273 and the second output stage frequency divider 272 and detects the phase difference between these outputs, a second integration circuit 275 which integrates the detection output from the second phase difference detection circuit 274, and a second voltage controlled oscillation circuit (VCO) 271 which uses the output from the second integration circuit 275 as a control voltage and produces the second local oscillation signal.

The frequency converter circuit is mounted, for example, on the receiving side of a mobile terminal and the second intermediate frequency signal, which is the output of the receiving side, is input to a later stage demodulation circuit 30, where the original baseband signal is demodulated. The demodulation is performed for each of a plurality of channels of a radio transmission signal from a base station cooperating with the mobile terminal, selecting one of the channels at a time. The selection of the channels is performed by giving from the outside a division specifying signal DIV corresponding to the selected channel to the first output stage frequency divider 242 in the synthesizer.

For example, the variable frequency divider 242 is made so as, for example, to divide the first local oscillation signal into signals of 25 kHz. In this case, the dividing ratio of the frequency divider 242 is controlled based on the received channel selection data (DIV). Due to this, the first local oscillation frequency is matched with the frequency in accordance with the received channel. The frequency divider 244, like the variable frequency divider 242, is made to divide the oscillation frequency of the reference oscillation unit 36 to 25 kHz. In this case, however, the dividing ratio is fixed.

On the other hand, in FIG. 6, the frequency divider 272 divides the oscillation output of the VCO 271 to 5 kHz. Further, the frequency divider 273 divides the oscillation frequency of the reference oscillation unit 36 to 5 kHz.

Figure 7:
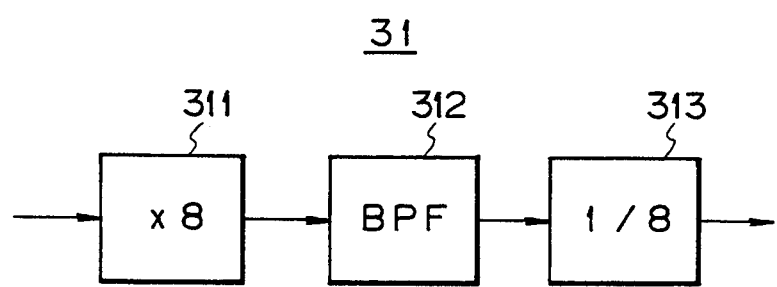
FIG. 7 is a circuit diagram showing a detailed example of the block 31 in FIG. 4.

FIG. 7 is a circuit diagram showing a detailed example of the block 31 in FIG. 4. That is, the carrier component extraction unit 31 comprises a multiplication circuit 311 which receives as input the second intermediate frequency signal and multiplies it by N, a band pass filter 312 which is connected to the output of the multiplication circuit 311 and makes the frequency of N times the frequency corresponding to the true value of the frequency of the second intermediate frequency signal the center frequency of the band, and a frequency divider 313 which receives as input the output of the band pass filter 312, performs 1/N division of the frequency of the output, and extracts the carrier frequency of the second intermediate frequency signal.

More specifically, the frequency multiplier circuit 311 is an eight-times frequency multiplier circuit which multiplies by 8 the second intermediate frequency signal output from the amplitude limiting amplification circuit 29. The multiplied output of the eight-times frequency multiplier circuit is supplied to the band pass filter 312 which has a center frequency 8 times the carrier frequency (455 kHz) of the second intermediate frequency signal.

By this, the carrier component of the second intermediate frequency signal is extracted. This extraction output is divided by 8 by the ⅛ division circuit 313. By this, the carrier extracted carrier component is returned to its original frequency.

In the constitution of FIG. 4, first, an explanation will be made of the AFC operation. In general, an RF signal sent from a base station, as mentioned earlier, is produced using a reference oscillation circuit of a precision of better than 0.1 ppm. Therefore, if the true value of the RF frequency is made fR, then the actual frequency of the received RF signal output from the band pass filter 22 may be deemed to be fR.

As opposed to this, the first local oscillation signal output from the synthesizer 24 is produced based on the oscillation circuit of a reference oscillation unit 26 having a precision of about 3 ppm. Therefore, the first local oscillation signal has a frequency deviation in accordance with the frequency deviation of the reference oscillation unit 36. If the frequency deviation is ΔfL1, the actual frequency of the first local oscillation signal becomes fL1+ΔfL1. Here, fL1 is the true value of the frequency of the first local oscillation signal. By this, the frequency fIF1 of the first intermediate frequency signal output from the first mixing circuit 23 becomes:

$$fIF1 = fR - (fL1 + \Delta fL1) \tag{1}$$

Similarly, the second local oscillation signal output from the PLL circuit 27 has a frequency deviation in accordance with the frequency deviation of the reference oscillation unit 36. If this frequency deviation is made ΔfL2, then the actual frequency of the second local oscillation signal becomes fL2+ΔfL2. Here, fL2 is the true value of the frequency of the second local oscillation signal. By this, the frequency fIF2 of the second intermediate frequency signal output from the second mixing circuit 26 becomes:

$$fIF2 = fR - (fL1 + \Delta fL1) - (fL2 + \Delta fL2) \tag{2}$$

The second intermediate frequency signal fIF2 is counted by the frequency counter 32, then at the subtraction unit 33, it is used for subtraction processing with the true value of the fIF2 stored in the table 34.

By this, the first local oscillation signal output from the synthesizer 24 and the second local oscillation signal output from the PLL circuit 27 are controlled in directions where the frequency deviations ΔfL1 and ΔfL2 are removed.

The above was the AFC operation. Next, an explanation will be made of the operation to remove the modulation wave of the carrier component extraction unit 31. For this explanation, use will be made of FIG. 8 and FIGS. 9A to 9C.

Figure 8:
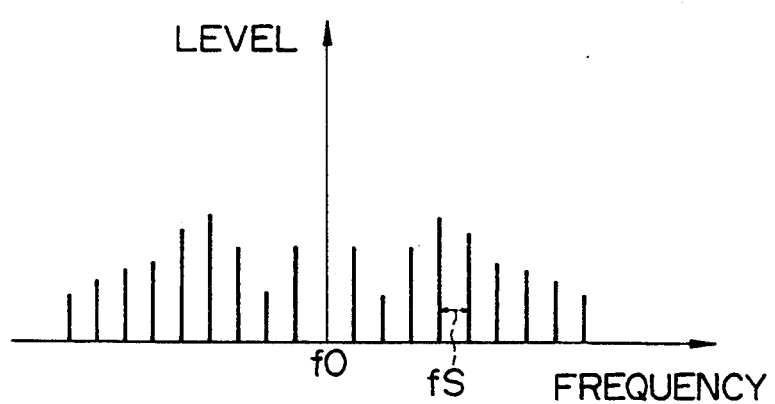
FIG. 8 is a view of the frequency spectrum of an analog frequency modulation method.

FIG. 8 is a view of the frequency spectrum of an analog frequency modulation method.

Figure 9A:
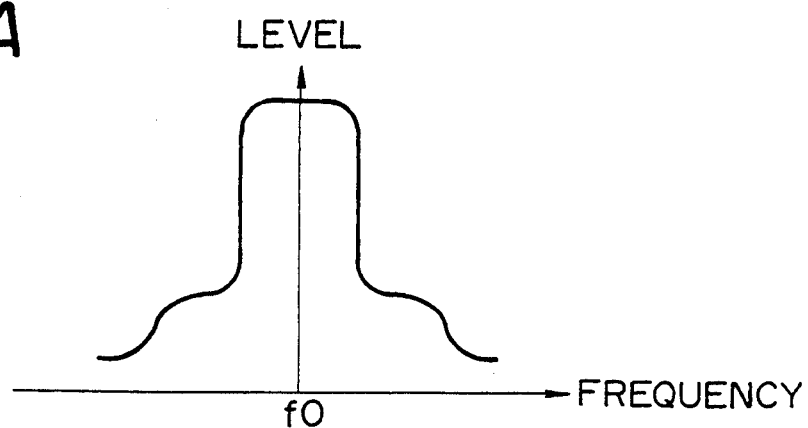
FIGS. 9A, 9B, and 9C are views showing the steps until removal of the modulated wave and extraction of the carrier component.
Figure 9B:
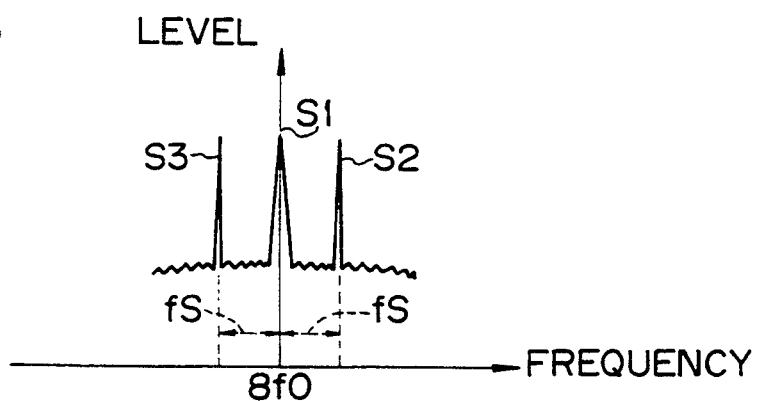
Figure 9C:
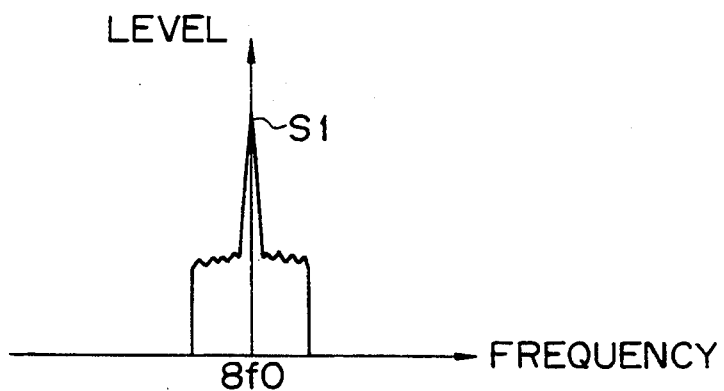

FIGS. 9A, 9B, and 9C are views showing the steps until removal of the modulated wave and extraction of the carrier component.

In the case of the analog frequency modulation method, the frequency spectrum of the signal being modulated extends at intervals of the modulation frequency fS about the carrier frequency f0, as shown in FIG. 8, based on a Bessel function B (fD/fS) expressed by the ratio of the modulation frequency fS and the frequency deviation fD. Note that fD shows the spread of the frequency in the right and left directions in the figure.

As opposed to this, in the case of a π/4 shift QPSK modulation method in a digital mobile telecommunication system, the frequency spectrum of the signal to be modulated extends in a state packed about f0 as shown in FIG. 9A. This is because the digital modulation signal is scrambled at the transmission side. That is, if the digital modulation signal is scrambled, the digital signal comes to have a frequency band the same as a noise signal. The digital modulation signal is scrambled to prevent bias of the code of the digital modulation signal. That is, in π/4 shift QPSK modulation, the code "1" or "0" of the digital modulation signal sometimes continues successively. If code bias arises in this way, the frequency spectrum of the signal to be modulated leans to the positive side or negative side of the carrier frequency f0 (=fR−fL1−fL2). Due to this, when the signal to be modulated is counted in frequency as is, sometimes a count error occurs. Therefore, as mentioned above, this code bias is prevented by scrambling the digital modulation signal at the transmission side.

The extent of the effect of prevention of bias due to scrambling is proportional to the length of the period of a pseudo noise (PN) pattern. Therefore, to obtain the desired effect of prevention of bias, it is necessary to lengthen the period of the PN pattern. Specifically, if the clock frequency is 21 kHz in a 15 stage PN pattern, 1 frame (that is, one period of the PN pattern) becomes a period of about 1.5 seconds.

As opposed to this, the count time of the frequency counter 32 cannot be made too long in view of the need for shortening the time from when the reception is started to when the AFC operation converges. Specifically, it is set to a time of about 100 msec. Therefore, even if the modulation signal is scrambled, in actuality it is almost impossible to prevent count error due to code bias.

Therefore, in this embodiment, the carrier component of the second intermediate frequency signal is extracted from the amplification output of the amplitude limiting amplification circuit 29 and the frequency of the carrier component is counted. That is, the amplification output of the amplitude limiting amplification circuit 29 is first multiplied by 8 by the eight-time frequency multiplier circuit 41 of FIG. 7. By this, as shown in FIG. 9B, the components S2 and S3 are removed and only the component S1 is extracted. After this, the output of the band pass filter 312 is divided by 8 by the ⅛ frequency divider 313. By this, the frequency of the carrier component S1 is converted to the original frequency.

If the carrier component of the second intermediate frequency signal is extracted and the frequency of the carrier component S1 is counted in this way, it is possible to perform the count operation without being affected by the congestion or bias of the frequency spectrum. Therefore, it is possible to obtain an accurate count.

Figure 10:
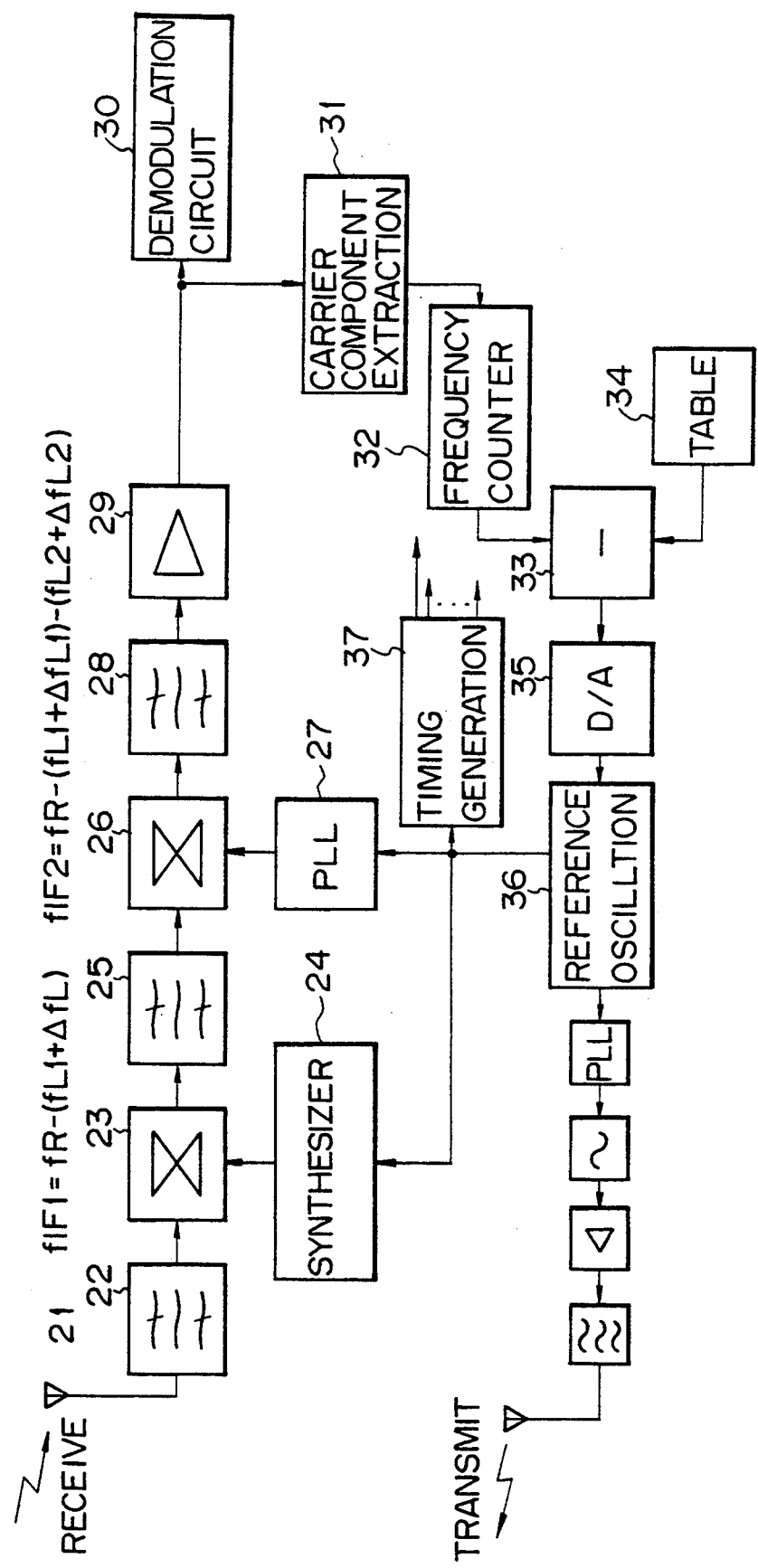
FIG. 10 is a view of an example of a mobile terminal having both a transmission side circuit and a receiving side circuit.

FIG. 10 is a view of an example of a mobile terminal having both a transmission side circuit and a receiving side circuit.

When the frequency converter circuit is mounted at the receiving side of a mobile terminal, the frequency of the transmitting side of the mobile terminal is stabilized by the transmitting side operating in synchronization with the output from the reference oscillation unit 36.

According to the embodiment of the present invention described above, the following effects can be obtained:

(1) First, the first and second local oscillation frequencies fL1 and fL2 are combined and controlled by the frequency feedback loop 15 and it is possible to obtain a stable second intermediate frequency IF2 even if the frequency stability of the reference oscillation unit 36 is low.

(2) In the case of counting the second intermediate frequency fIF2, the carrier component S1 of the second intermediate frequency signal is extracted and the frequency of the carrier component S1 is counted, so it is possible to accurately count the second intermediate frequency fIF2.

(3) Further, when finding the frequency deviation of the second intermediate frequency signal, the second intermediate frequency fIF2 is directly counted, so it is possible to reduce the convergence time of the AFC operation through the loop 15. That is, to find the frequency deviation of the second intermediate frequency signal, it may be considered to count the first local oscillation frequency of the synthesizer 24 and the second local oscillation frequency of the PLL circuit 27. If this is done, however, since the first and second local oscillation frequencies fL1 and fL2 are extremely high, usually counting by a frequency counter comprised of CMOS transistors is not possible. Therefore, in such a case, it is necessary to divide in advance the first and second local oscillation frequencies fL1 and fL2. When performing such frequency division processing, to obtain the same count precision as in the case where no frequency division processing is performed, it is necessary to lengthen the count time. By this, the convergence time of the AFC operation becomes longer.

As opposed to this, in this embodiment, the second intermediate frequency fIF2 is directly counted. The second intermediate frequency is 455 kHz. Therefore, it is possible to count by a frequency counter 32 comprised of CMOS transistors. By this, in this embodiment, it is possible to shorten the convergence time of the AFC operation over the case of counting the first and second local oscillation frequencies.

(4) Further, as mentioned above, since it is possible to shorten the count time of the frequency counter 32, it also becomes possible to repeatedly perform the count operation a number of times in a preset time for the AFC operation by the loop 15. This makes it possible to make use the average of a plurality of count values as the final count value and thereby raise the count precision.

An embodiment of the present invention was explained in detail above, but the invention is not limited to this embodiment.

(1) For example, in the above embodiment, the explanation was made of the case where the carrier component S1 extracted by the band pass filter 312 of the carrier component extraction unit 31 was divided by 8 in the ⅛ frequency divider and thereby the frequency of the carrier component S1 was returned to the original frequency.

In this invention, however, the extraction output of the band pass filter 312 may also be counted as it is without returning the frequency of the carrier component S1 to the original frequency.

According to this construction, it is possible to count a frequency higher than in the above embodiment. If the same time as in the above embodiment is set as the count time, it is possible to raise the count precision from the above embodiment.

On the other hand, if the same count precision as in the above embodiment is acceptable, then the count time may be shortened from the above embodiment.

(2) Further, in the above embodiment, the explanation was made of the case of use of the present invention for frequency conversion of a received signal subjected to $\pi/4$ shift QPSK modulation. This method, however, may also be applied to the frequency conversion of a received signal modulated by the QPSK modulation or other modulation system. Note that when the modulation method is, for example, the QPSK modulation method, the multiplying ratio of the carrier component extraction unit 31 is set to 4.

(3) Further, in the above embodiment, the explanation was made of the case of use of the present invention for a frequency converter circuit of a mobile terminal of a mobile telecommunication system, but the invention may also be applied to a frequency converter circuit of a telecommunication system other than the above system.

(4) In addition, various modifications may be made to the present invention, of course, to an extent not exceeding the gist of the invention.

As explained above in detail, according to the present invention, it is possible to provide a frequency converter circuit, in a mobile terminal of a digital mobile telecommunication system, which can give a second intermediate frequency signal with a high frequency stability even with a low frequency stability of the reference oscillation circuit.

We claim:

1. A frequency converter apparatus which receives a PSK modulated signal, the apparatus comprising:
   a first frequency conversion device which receives the PSK modulated signal and a first local oscillation signal and mixes the received PSK modulated signal and the first local oscillation signal to thereby produce a first intermediate frequency signal having a respective frequency approximately equal to the difference between the respective frequencies of the received PSK modulated signal and the first local oscillation signal;
   a second frequency conversion device which receives the first intermediate frequency signal and a second local oscillation signal and mixes the first intermediate frequency signal and the second local oscillation signal to thereby produce a second intermediate frequency signal having a respective frequency approximately equal to the difference between the respective frequencies of the first intermediate frequency and the second local oscillation signal; and
   a frequency feedback loop comprising:
     a frequency difference detection means for detecting the frequency difference between the actual frequency of the second intermediate frequency signal and the true value at which the frequency of the second intermediate frequency signal should be, and producing a corresponding detection output, the frequency difference detection means comprising a carrier component extraction unit which extracts the carrier component from the second intermediate frequency signal for use in determining the frequency difference, the carrier component being extracted by multiplying the second intermediate frequency signal by N, where N is an integer greater than or equal to two and N is determined by the number of shifts and the number of phases for defining the PSK modulation, and
     a frequency control means, responsive to the detection output of the frequency difference detection means, for controlling in common the respective frequencies of the first intermediate frequency signal and the second intermediate frequency signal, the frequency control means comprising:

a reference oscillation unit which receives the detection output of the frequency difference detection means and produces an oscillation output having an oscillation frequency controlled in accordance with the received detection output, a first phase synchronization unit which receives the oscillation output of the reference oscillation unit and synchronizes the phase of the first local oscillation signal with respect to the phase of the oscillation output, the first phase synchronization unit being a synthesizer circuit, and a second phase synchronization unit which receives the oscillation output of the reference oscillation unit and synchronizes the phase of the second local oscillation signal with respect to the phase of the oscillation output, the second phase synchronization unit being a phase-locked loop circuit.

2. A frequency converter apparatus as set forth in claim 1, wherein:

the first phase synchronization unit comprises:
a first input stage frequency divider which receives the oscillation output from the reference oscillation unit and produces a corresponding frequency divided outruns, and
a first output stage frequency divider which receives the first local oscillation signal and produces a corresponding frequency divided output;

the second phase synchronization unit comprises:
a second input stage frequency divider which receives the oscillation output from the reference oscillation unit and produces a corresponding frequency divided output, and
a second output stage frequency divider which receives the second local oscillation signal and produces a corresponding frequency divided output;

where the following relationships exist:
$m = K \cdot n$, where $K = fL1/fL2$ and $fL1$ is the frequency of the first local oscillation signal and $fL2$ is the frequency of the second local oscillation signal,
$m = Q/P$ and $n = S/R$ where the dividing ratios of the respective first input stage frequency divider, first output stage frequency divider, second input stage frequency divider and second output stage frequency divider are as follows:
first input stage frequency divider: Q;
first output stage frequency divider: P;
second input stage frequency divider: S;
second output stage frequency divider: R.

3. A frequency converter apparatus as set forth in claim 2, wherein the first phase synchronization unit further comprises:

a first phase comparison means for receiving the corresponding frequency divided outputs of the first input stage frequency divider and the first output stage frequency divider, detecting the phase difference therebetween and producing a corresponding detection output;

a first integration circuit which integrates the detection output from the first phase comparison means and produces a corresponding integration output; and a first voltage controlled oscillation circuit which is responsive to the integration output of the first integration circuit to produce the first local oscillation signal.

4. A frequency converter apparatus as set forth in claim 2, wherein the second phase synchronization unit further comprises:

a second phase comparison means for receiving the corresponding frequency divided outputs of the second input stage frequency divider and the second output stage frequency divider, detecting the phase difference therebetween and producing a corresponding detection output;

a second integration circuit which integrates the detection output from the second phase comparison means and produces a corresponding integration output; and a second voltage controlled oscillation circuit which is responsive to the integration output of the second integration circuit to produce the second local oscillation signal.

5. A frequency converter apparatus as set forth in claim 2, further comprising a demodulation circuit which demodulates the original baseband signal, wherein:

the frequency converter apparatus is mounted on the receiving side of a mobile terminal and the second intermediate frequency signal is input to the demodulation circuit, the demodulation is performed for each of a plurality of channels of a radio transmission signal received from a base station cooperating with the mobile terminal by selecting one of the plurality of channels at a time, the selection of the channels in accordance with an externally provided division specifying signal corresponding to the selected channel, the division specifying signal being provided to the first output stage frequency divider of the first phase synchronization unit.

6. A frequency converter apparatus as set forth in claim 1, wherein the frequency difference detection means further comprises:

a frequency counter which counts the carrier frequency of the carrier component extracted by the carrier component extraction unit;

a table which stores as data the true value of the frequency at which the second intermediate frequency signal should be; and a subtraction unit which determines the difference between the true value stored in the table and the carrier frequency counted by the frequency counter and, based on the difference, controls the oscillation frequency of the the reference oscillation unit.

7. A frequency converter apparatus as set forth in claim 6, wherein the frequency feedback loop further comprises a timing generation circuit which operates in synchronization with the oscillation output of the reference oscillation unit, produces a time base signal to control the frequency counter, a subtraction control timing signal to control the subtraction unit, and a reading control timing signal to control the table.

8. A frequency converter apparatus as set forth in claim 6, wherein the frequency counter, the subtraction unit and the table are formed as digital circuits, the reference oscillation unit is formed as an analog circuit, and a digital/analog converter is inserted between the output of the subtraction unit and the reference oscillation unit.

9. A frequency converter apparatus as set forth in claim 1, wherein the carrier component extraction unit comprises:
a frequency multiplier circuit which receives the second intermediate frequency signal, multiplies it by N and produces a corresponding output;
a band pass filter having a center frequency of N times the frequency corresponding to the true value of the frequency of the second intermediate frequency signal and receiving the corresponding output of the frequency multiplier circuit to thereby produce a filtered output; and
a frequency divider which receives the filtered output of the band pass filter and performs 1/N frequency division.

10. A frequency converter apparatus as set forth in claim 1, wherein a mobile terminal has a transmitting side and receiving side, the frequency converter apparatus is mounted at the receiving side of the mobile terminal and the frequency of the transmitting side of the mobile terminal is stabilized with the oscillation output of the reference oscillation unit.

11. A frequency converter apparatus as set forth in claim 1, wherein:
the first frequency conversion device comprises:
a first band pass filter which filters the received PSK modulated signal;
a first mixing circuit which is connected to the first band pass filter, receives the first local oscillation signal and produces a corresponding mixed output; and
a second band pass filter which receives and filters the mixed output of the first mixing circuit and produces a corresponding filtered output; and
the second frequency conversion device comprises:
a second mixing circuit which is connected to the second band pass filter, receives the filtered output of the second band pass filter and the second local oscillation signal and produces a corresponding mixed output;
a third band pass filter which receives and filters the mixed output of the second mixing circuit, and
an amplitude limiting amplifier which receives the second intermediate frequency signal through the third band pass filter.

12. A frequency converter apparatus which receives a PSK modulated signal, the apparatus comprising:
a first frequency conversion device which receives the PSK modulated signal and a first local oscillation signal and mixes the received PSK modulated signal and the first local oscillation signal to thereby produce a first intermediate frequency signal having a respective frequency approximately equal to the difference between the respective frequencies of the received PSK modulated signal and the first local oscillation signal;
a second frequency conversion device which receives the first intermediate frequency signal and a second local oscillation signal and mixes the first intermediate frequency signal and the second local oscillation signal to thereby produce a second intermediate frequency signal having a respective frequency approximately equal to the difference between the respective frequencies of the first intermediate frequency and the second local oscillation signal; and
a frequency feedback loop comprising:
a frequency difference detection means for detecting the frequency difference between the actual frequency of the second intermediate frequency signal and the true value at which the frequency of the second intermediate frequency signal should be, and producing a corresponding detection output, and
a frequency control means, responsive to the detection output of the frequency difference detection means, for controlling in common the respective frequencies of the first intermediate frequency signal and the second intermediate frequency signal, the frequency control means comprising:
a reference oscillation unit which receives the detection output of the frequency difference detection means and produces an oscillation output having an oscillation frequency controlled in accordance with the received detection output,
a first phase synchronization unit which receives the oscillation output of the reference oscillation unit and synchronizes the phase of the first local oscillation signal with respect to the phase of the oscillation output, the first phase synchronization unit being a synthesizer circuit and comprising:
a first input stage frequency divider which receives the oscillation output from the reference oscillation unit and produces a corresponding frequency divided output, and
a first output stage frequency divider which receives the first local oscillation signal and produces a corresponding frequency divided output, and
a second phase synchronization unit which receives the oscillation output of the reference oscillation unit and synchronizes the phase of the second local oscillation signal with respect to the phase of the oscillation output, the second phase synchronization unit being a phase-locked loop circuit and comprising:
a second input stage frequency divider which receives the oscillation output from the reference oscillation unit and produces a corresponding frequency divided output and
a second output stage frequency divider which receives the second local oscillation signal and produces a corresponding frequency divided output; and
where the following relationships exist:
$m = K \cdot n$, where $K = fL1/fL2$ and $fL1$ is the frequency of the first local oscillation signal and $fL2$ is the frequency of the second local oscillation signal,
$m = Q/P$ and $n = S/R$
where the dividing ratios of the respective first input stage frequency divider, first output stage frequency divider, second input stage frequency divider and second output stage frequency divider are as follows:
first input stage frequency divider: Q;
first output stage frequency divider: P;
second input stage frequency divider: S;
second output stage frequency divider: R.

13. A frequency converter apparatus as set forth in claim 12, wherein the first phase synchronization unit further comprises:
- a first phase comparison means for receiving the corresponding frequency divided outputs of the first input stage frequency divider and the first output stage frequency divider, detecting the phase difference therebetween and producing a corresponding detection output;
- a first integration circuit which integrates the detection output from the first phase comparison means and produces a corresponding integration output; and
- a first voltage controlled oscillation circuit which is responsive to the integration output of the first integration circuit to produce the first local oscillation signal.

14. A frequency converter apparatus as set forth in claim 12, wherein the second phase synchronization unit further comprises:
- a second phase comparison means for receiving the corresponding frequency divided outputs of the second input stage frequency divider and the second output stage frequency divider, detecting the phase difference therebetween and producing a corresponding detection output;
- a second integration circuit which integrates the detection output from the second phase difference detection circuit and produces a corresponding integration output; and
- a second voltage controlled oscillation circuit which is responsive to the integration output of the second integration circuit to produce the second local oscillation signal.

15. A frequency converter apparatus as set forth in claim 12, further comprising a demodulation circuit which demodulates the original baseband signal, wherein:
- the frequency converter apparatus is mounted on the receiving side of a mobile terminal and the second intermediate frequency signal is input to the demodulation circuit,
- the demodulation is performed for each of a plurality of channels of a radio transmission signal received from a base station cooperating with the mobile terminal by selecting one of the plurality of channels at a time, and
- selection of the channels is in accordance with an externally provided division specifying signal corresponding to the selected channel, the division specifying signal being provided to the first output stage frequency divider of the first phase synchronization unit.

16. A frequency converter apparatus which receives a PSK modulated signal, the apparatus comprising:
- a first frequency conversion device which receives the PSK modulated signal and a first local oscillation signal and mixes the received PSK modulated signal and the first local oscillation signal to thereby produce a first intermediate frequency signal having a frequency approximately equal to the difference between the respective frequencies of the received PSK modulated signal and the first local oscillation signal;
- a second frequency conversion device which receives the first intermediate frequency signal and a second local oscillation signal and mixes the first intermediate frequency signal and the second local oscillation signal to thereby produce a second intermediate frequency signal having a frequency approximately equal to the difference between the respective frequencies of the first intermediate frequency and the second local oscillation signal; and
- a frequency feedback loop comprising:
  - a frequency difference detection means for detecting the frequency difference between the actual frequency of the second intermediate frequency signal and the true value at which the frequency of the second intermediate frequency signal should be, and producing a corresponding detection output, the frequency difference detection means comprising:
    - a carrier component extraction unit which extracts the carrier component from the second intermediate frequency signal by multiplying the second intermediate frequency signal by N, where N is an integer greater than or equal to two and determined by the number of shifts and the number of phases for defining the PSK modulation,
    - a frequency counter which counts the carrier frequency extracted by the carrier component extraction unit,
    - a table which stores as data the true value which the second intermediate frequency signal should have, and
    - a subtraction unit which determines the difference between the true value stored in the table and the carrier frequency counted by the frequency counter and, based on the difference, controls the oscillation frequency of the reference oscillation unit,
  - a frequency control means, responsive to the detection output of the frequency difference detection means, for controlling in common the respective frequencies of the first intermediate frequency signal and the second intermediate frequency signal, the frequency control means comprising:
    - a reference oscillation unit which receives the detection output of the frequency difference detection means and produces an oscillation output having an oscillation frequency controlled in accordance with the received detection output,
    - a first phase synchronization unit which receives the oscillation output of the reference oscillation unit and synchronizes the phase of the first local oscillation signal with respect to the phase of the oscillation output, and
    - a second phase synchronization unit which receives the oscillation output of the reference oscillation unit and synchronizes the phase of the second local oscillation signal with respect to the phase of the oscillation output.

17. A frequency converter apparatus as set forth in claim 16, wherein the carrier component extraction unit comprises:
- a frequency multiplier circuit which receives the second intermediate frequency signal, multiplies it by N and produces a corresponding output;
- a band pass filter having a center frequency of N times the frequency corresponding to the true value of the frequency of the second intermediate frequency signal and receiving the corresponding output of the frequency multiplier circuit to thereby produce a filtered output; and a frequency divider which receives the filtered output of the band pass filter and performs 1/N division of the frequency of the second intermediate frequency signal.

18. A frequency converter apparatus which receives a PSK modulated signal, the apparatus comprising:

a first frequency conversion device which receives the PSK modulated signal and a first local oscillation signal and mixes the received PSK modulated signal and the first local oscillation signal to thereby produce a first intermediate frequency signal having a frequency approximately equal to the difference between the respective frequencies of the received PSK modulated signal and the first local oscillation signal;

a second frequency conversion device which receives the first intermediate frequency signal and a second local oscillation signal and mixes the first intermediate frequency signal and the second local oscillation signal to thereby produce a second intermediate frequency signal having a frequency approximately equal to the difference between the respective frequencies of the first intermediate frequency and the second local oscillation signal; and a frequency feedback loop comprising:

a frequency difference detection means for detecting the frequency difference between the actual frequency of the second intermediate frequency signal and the true value at which the frequency of the second intermediate frequency signal should be, and producing a corresponding detection output, the frequency difference detection means comprising:

a carrier component extraction unit which extracts the carrier component from the second intermediate frequency signal, a frequency counter which counts the carrier frequency extracted by the carrier component extraction unit, a table which stores as data the true value which the second intermediate frequency signal should have; and a subtraction unit which determines the difference between the true value stored in the table and the carrier frequency counted by the frequency counter and, based on the difference, controls the oscillation frequency of the reference oscillation unit; and a frequency control means, responsive to the detection output of the frequency difference detection means, for controlling in common the respective frequencies of the first intermediate frequency signal and the second intermediate frequency signal, the frequency control means comprising:

a reference oscillation unit which receives the detection output of the frequency difference detection means and produces an oscillation output having an oscillation frequency controlled in accordance with the received detection output, a first phase synchronization unit which receives the oscillation output of the reference oscillation unit and synchronizes the phase of the first local oscillation signal with respect to the phase of the oscillation output, the first phase synchronization unit being a synthesizer circuit, and a second phase synchronization unit which receives the oscillation output of the reference oscillation unit and synchronizes the phase of the second local oscillation signal with respect to the phase of the oscillation output, the second phase synchronization unit being a phase-locked loop circuit, and a timing generation circuit which operates in synchronization with the oscillation output of the reference oscillation unit, produces a time base signal for use by the frequency counter, a subtraction control timing signal for use by the subtraction unit, and a reading control timing signal for use by the table.

* * * * *

UNITED STATES PATENT AND TRADEMARK OFFICE
CERTIFICATE OF CORRECTION

PATENT NO. : 5,388,125
DATED : Feb. 7, 1995
INVENTOR(S) : TODA et al.

It is certified that error appears in the above-indentified patent and that said Letters Patent is hereby corrected as shown below:

TITLE PAGE:

[56] References Cited, OTHER PUBLICATIONS:
line 2, change "JP-A-161415" to --JP-A-55 161415--;

[57] ABSTRACT, line 15, after "that" delete "a".

Col. 4, line 27, after "signals" insert --.--.

Col. 7, line 25, change "27 PLL circuit" to --(PLL circuit) 27--.

Col. 13, line 30 (Claim 2, line 7), change "outruns" to --output--.

Col. 14, line 55 (Claim 6, line 14), delete "the" (second occurrence)

Signed and Sealed this

Thirteenth Day of May, 1997

*Attest:*

BRUCE LEHMAN

*Attesting Officer*   Commissioner of Patents and Trademarks